(12) United States Patent
Arai et al.

(10) Patent No.: US 6,597,109 B1
(45) Date of Patent: *Jul. 22, 2003

(54) ORGANIC EL DEVICE AND METHOD FOR PRODUCTION THEREOF

(75) Inventors: Michio Arai, Tokyo (JP); Kenji Nakaya, Chiba (JP); Tetsushi Inoue, Chiba (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 764 days.

(21) Appl. No.: 09/110,127

(22) Filed: Jul. 6, 1998

(30) Foreign Application Priority Data

Jul. 16, 1997 (JP) .................................. 9-207236

(51) Int. Cl.$^7$ ............................................. H05B 33/00
(52) U.S. Cl. .................. 313/506; 313/504; 428/917
(58) Field of Search ..................... 313/506, 504, 313/509; 428/690, 917; 315/169.3

(56) References Cited

U.S. PATENT DOCUMENTS

| | | | | | |
|---|---|---|---|---|---|
| 5,216,331 A | * | 6/1993 | Hosokawa et al. | ......... | 313/498 |
| 5,766,779 A | * | 6/1998 | Shi et al. | .................... | 313/506 |
| 5,811,833 A | * | 9/1998 | Thompson | .................... | 313/504 |
| 5,958,609 A | * | 9/1999 | Ueda et al. | .................. | 313/506 |

FOREIGN PATENT DOCUMENTS

| | | |
|---|---|---|
| JP | 4-85389 | 3/1992 |
| JP | 05-121168 | 5/1993 |
| JP | 6-93256 | 4/1994 |
| JP | 8-239657 | 9/1996 |

* cited by examiner

Primary Examiner—Ashok Patel
(74) Attorney, Agent, or Firm—Oblon, Spivak, McClelland, Maier & Neustadt, P.C.

(57) ABSTRACT

The object of the present invention is to provide an organic EL device capable of preventing current leakage and maintaining a long lifetime, a high luminance, a high efficiency and a high display quality. The object can be achieved by an organic EL element comprising a hole injecting electrode, an electron injecting electrode and at least one organic layer placed between these electrodes, wherein the organic layer has a thickness of at least 100 nm and an electron- or hole-mobility of $0.5–5\times10^{-3}$ cm$^2$/V.s.

2 Claims, 3 Drawing Sheets

ORGANIC EL DEVICE AND METHOD FOR PRODUCTION THEREOF

BACKGROUND OF THE INVENTION

1. Field of the Invention

The present invention relates to an organic EL device using an organic compound, and more particularly to structure of an organic layer for preventing occurrence or current leakage and a method for production thereof.

2. Prior Art

Recently, active research works have been made on organic EL devices. As a basic configuration, the organic EL device includes a thin film of hole transporting material such as triphenyldiamine (TPD) or the like formed by evaporation on a hole injecting electrode, a light emitting layer made of aluminum quinolinol complex (Alq3) or the like laminated thereon, and a metal electrode (electron injecting electrode) formed thereon from a metal having a low work function such as magnesium. Such organic EL devices are watched with interest because they can achieve so high a luminance as ranging from several 100 to several 10,000 cd/m$^2$ with a drive voltage of approximately 10 volts.

In the manufacture of displays using such an organic EL device, it is an important problem how to lower the proportion of defective product. That is, there can arise various troubles such as uneven lamination of organic layers, damaging of organic layers in the lamination of functional thin films such as electron injecting electrode or the like, contamination of electron injecting electrode itself by impurities or oxidation thereof which cause the so-called irregular luminance or defective dot or unevenness in quality. Especially, the occurrence of leakage current is an important problem. A current of reverse direction (leakage current), if ever, brings about deterioration of display quality such as cross talk, uneven luminance, etc. and further-energy consumption not contributing to light emission such as unnecessary heating of device, and thereby a reduction of light emission efficiency.

SUMMARY OF THE INVENTION

Object of the Invention

The object of the present invention consists in realizing an organic EL device capable of preventing current leakage and retaining a long lifetime, a high luminance, a high efficiency and a high display quality.

Means for Solution of the Problem

The present inventors have conducted extensive studies on the mechanism of occurrence of leakage current. As a result, it has bee found that one of the predominant causes is the existence of minute dusts. Further, it has also been found that another cause participating in the leakage is the fine protrusions present on the hole injecting electrode. Based on these findings, the present invention has been accomplished.

The object mentioned above can be achieved by the following constructions (1)–(6):

(1) An organic EL device comprising a hole injecting electrode, an electron injecting electrode and at least one organic layer located between said electrodes, wherein at least one of the organic layers has a thickness of no less than 100 nm and a hole mobility or electron mobility of 0.5–5× 10$^{-3}$ cm$^2$/V.s.

(2) The organic EL device of (1), wherein one of the organic layers is located at the lowermost position, and it is any of hole injecting layer, hole transporting layer, hole injecting and transporting layer and light emitting layer, and thickness thereof is 100–400 nm.

(3) A method for preparing an organic EL device, which comprises forming a film of hole injecting electrode on a substrate, and then forming thereon at least one organic layer so that thickness of said organic layer comes to no less than 20% of average particle diameter of dusts.

(4) The method of (3), wherein said average particle diameter of dusts is an average particle diameter or dusts having a particle diameter of 0.3–1 μm and floating in the film-making chamber.

(5) The method of (3) or (4), wherein said organic layer is any of hole injecting layer, hole transporting layer, hole injecting and transporting layer and light emitting layer.

(6) The method of (3) to (5) for obtaining an organic EL device of (1) or (2).

Functions

Figure 3:
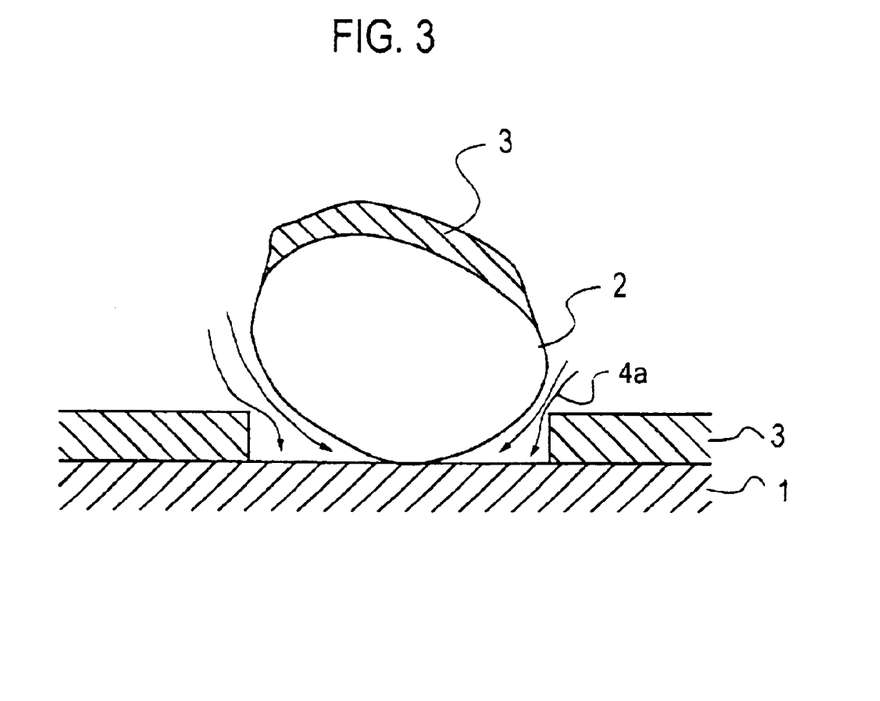
FIG. 3 is a schematic view illustrating the relation between an organic layer, dusts and an electron injecting electrode formed thereon, wherein the organic layer has a small thickness.

Prior organic EL devices exhibit the so-called diode characteristics, namely a nature of not readily passing a current of reverse direction. Further, in prior EL devices, thickness of the organic layer and electron injecting electrode, except for hole injecting electrode, is about 100–200 nm. Since light is emitted at such a small layer thickness, the display can exhibit quite excellent performance. But, if dusts exist at the time of forming the organic layer, leakage current readily arises. That is, as shown in FIG. 3, when dust 2 is attached to the surface of picture elements after film formation of hole injecting electrode 1 and if the organic layer 3 is formed by evaporation method, shadowing takes place, due to which straightforwardly advancing vapor particles do not adhere to the shadow of dusts and there appears a gap between the formed organic layer 3 and dust 2 in the part of shadow.

Figure 4:
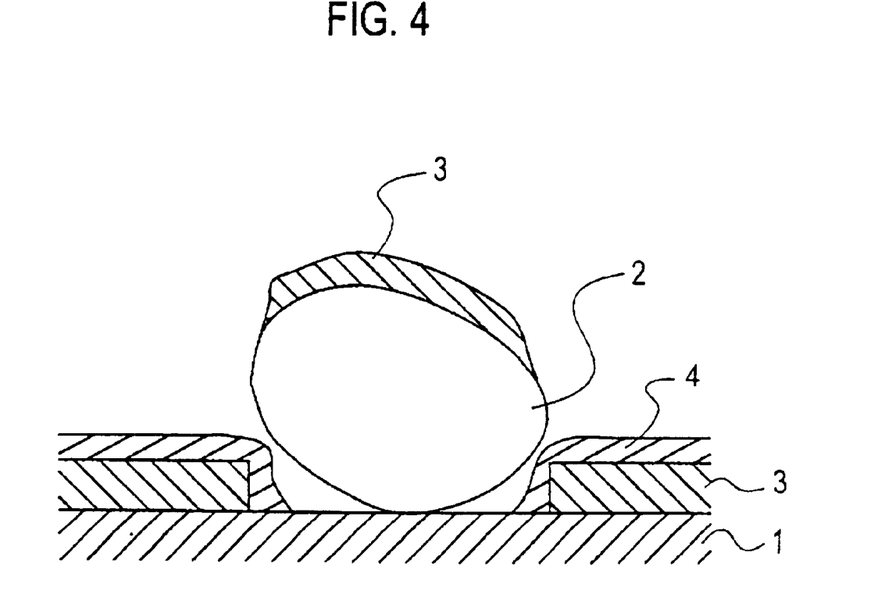
FIG. 4 is a view illustrating the state of electron injecting electrode film formed from the state of FIG. 3.

If electron injecting electrode is formed by sputtering as shown in FIG. 4, the sputtered particles 4a having a high throwing power are thrown into the shadow area to form electron injecting electrode even in the shadow area. Thus, in the shadow area, the hole injecting electrode 1 and the electron injecting electrode 4 are directly connected to each other without interception by organic layer 3, due to which a leakage current arises.

Figure 5:
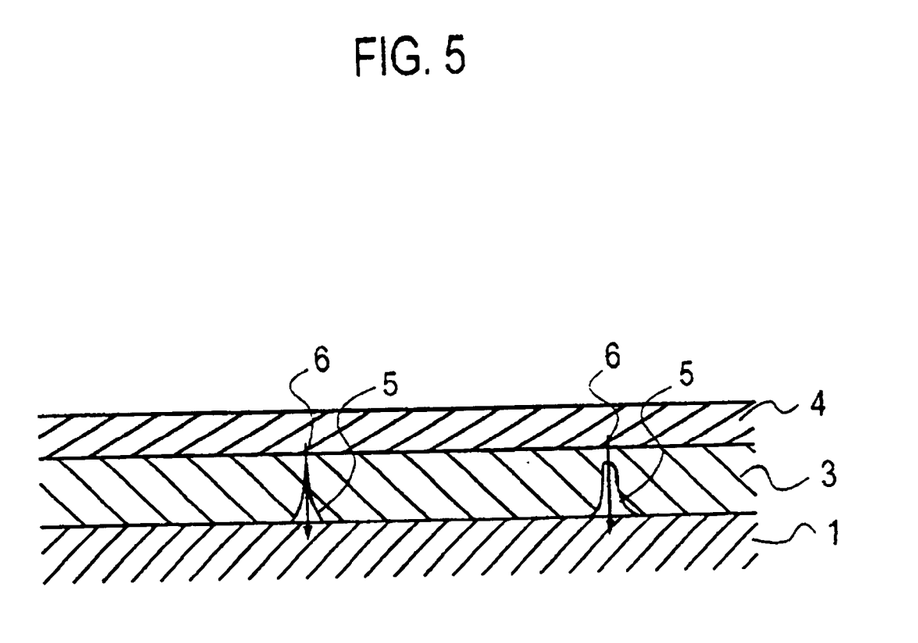
FIG. 5 is a schematic view illustrating the occurrence of leakage current due to protrusions present on hole injecting electrode.

Further, as shown in FIG. 5, hole injecting electrode 1 can sometimes have thereon protrusions 5 formed by deformation of electrode-constituting material or abnormal crystal growth thereof. When such protrusion 5 is present, the protrusion can pierce through the laminated organic layer 3. Even if it does not pierce, the protrusion causes a breakage of insulation when the position of protrusion 5 is close to electron injecting electrode 4, due to which short circuit arises between hole injecting electrode 1 and electron injecting electrode or a leakage current 6 arises. Especially since hole injecting electrode 1 is made of a conductor, protrusion 5 readably causes leakage current 6.

Figure 2:
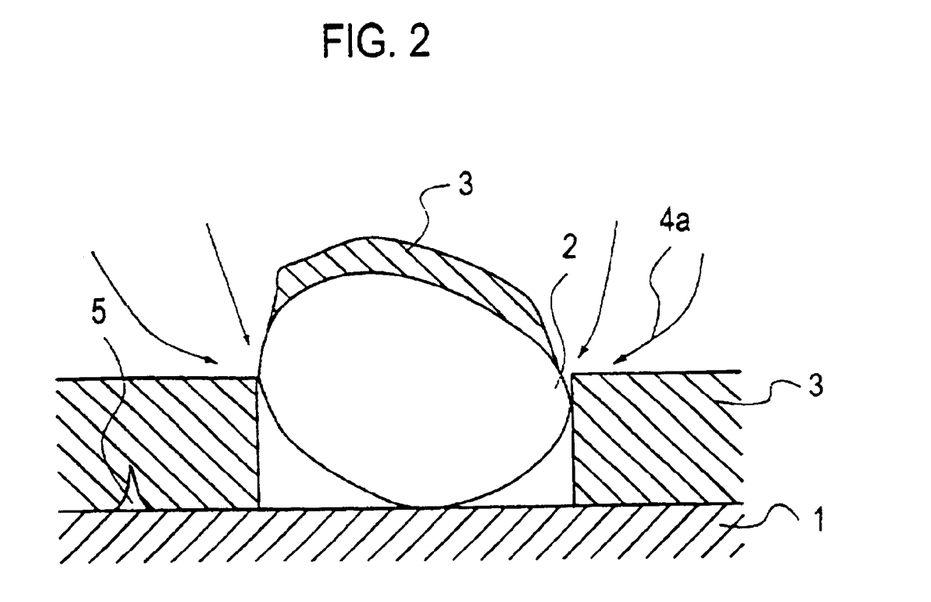
FIG. 2 is a schematic view illustrating the relation between an organic layer, dusts and an electron injecting electrode formed thereon, wherein the organic layer has a large thickness.

The occurrence of leakage current can be prevented by, as shown in FIG. 2, adjusting film thickness of organic layer 3 to a value allowing no existence of gap with dust 2, or by increasing the film thickness to a value sufficiently larger than the height of protrusion 5. By such means, the sputtered particle 4a becomes unable to enter the shadow part or the thickness of organic layer can be made to exceed the height of protrusion 5 sufficiently, so that occurrence of leakage current can be prevented.

BRIEF DESCRIPTION OF THE DRAWINGS

wherein 1 is substrate, 2 is dust, 3 is organic layer, 4 is electron injecting electrode, 4a is sputtered particles, 5 is protrusion, 6 is leakage current, 21 is substrate, 22 is hole injecting electrode, 23 is hole injecting and transporting layer, 24 is light emitting layer, 25 is electron injecting electrode, and 26 is protective electrode.

DETAILED DESCRIPTION OF THE INVENTION

Next, concrete construction of the present invention will be detailed below.

The EL device produced according to the method of the present invention has a hole injecting electrode, an electron injecting electrode and at least one organic layer provided between these electrodes, wherein said organic layer has a thickness of no less than 100 nm and an electron- or hole-mobility of $0.5–5\times10^{-3}$ cm$^2$/V.s.

Said "at least one organic layer" has a thickness of no less than 100 nm, and preferably no less than 200 nm. The upper limit thereof is preferably no more than 400 nm and further preferably no more than 300 nm. Preferably, said at least one organic layer is laminated so as to form the lowermost layer. If thickness thereof is too great, hole mobility and efficiency of light emission are low.

The electron- and hole-mobility, especially hole-mobility of the at least one organic layer is $0.5–5\times10^{-3}$ cm$^2$/V.s, and preferably $0.8–5\times10^{-3}$ V.s/cm$^2$. If electron- and hole-mobility is too low, efficiency of light emission and luminance of light emission are low.

As the layer for adjusting film thickness and electron- and hole-mobility to the above-mentioned range, organic layers located in the lowermost position and having hole injecting and transporting function such as hole injecting layer, hole transporting layer, hole injecting and transporting layer, light emitting layer, etc. are preferable. These organic layers are preferable because they exercise no adverse influence even when their thickness is larger than usual value. Preferably, thickness of the organic layers other than the organic layers having hole injecting and transporting function is about 50–200 nm in the total.

Preferably, thickness of the organic layer is made to no less than 20% and more preferably no less than 30% of the number average particle diameter of the dusts (0.3–1 μm) adhering at the time of forming the organic layer. By adjusting the thickness of organic layer to the above-mentioned range, the gap between organic layer and dust can be eliminated and occurrence of leakage current can be prevented. The average particle diameter of the dust adhering to organic layer can be determined by directly investigating the dusts adhering to organic layer. Otherwise, the average particle diameter of the dusts floating in the film-making chamber may also be used, because the floating dusts adhere to the organic layer at the time of film making. The average particle diameter of the dusts is usually 1 μm or less, and dusts having an average diameter of 0.3–1 μm have an especially important meaning in clean room. Average diameter of dust is calculated by taking an average of major diameter and minor diameter. In a clean room, the average number of floating dusts having an average particle diameter of 0.3–1 μm is preferably not more than 5,000/m$^3$, and especially not more than 1,000 m$^3$. So far as the quantity of dust is in the above-mentioned range, the dusts present in film-making chamber can be controlled by the present invention, and the degree of cleaning can be suppressed to a relatively low level so that a film-making chamber (clean room) can be prepared inexpensively.

The hole injecting electrode on which the organic layer is laminated generally has protrusions of no more than 0.2 μm and usually about 0.05–0.2 μm in average height and about 0.1–0.5 μm in average diameter of bottom surface, in a number of about 0.01–3 protrusions/mm$^2$. The presence of such protrusions can be confirmed by means of SEM (scanning electron microscope).

Next, the organic layers will be explained in more detail, provided that thickness of each organic layer mentioned below is the thickness in a case where the considered layer is not used for adjustment of overall organic layer.

The light emitting layer has the function of injecting holes and electrons, a function of transporting them, and a function of recombining holes and electrons to form excitons. Preferably, a relatively neutral compound electronically is used in the light emitting layer.

The hole injecting and transporting layer has a function of facilitating the injection of holes from the hole injecting electrode, a function of stably transporting holes, and a function of intercepting electrons. The electron injecting and transporting layer has a function of facilitating the injection of electrons from the electron injecting electrode, a function of stably transporting electrons and a function of intercepting holes. These layers increase and enclose the holes and electrons, optimize their recombination region and improve the efficiency of light emission.

In the usual embodiment, thickness of light emitting layer, thickness of hole injecting and transporting layer and thickness of electron injecting and transporting layer are not critical, and they are usually abut 5–500 nm and preferably 10–300 nm, though the thickness may vary depending on the method of forming.

Usually, thickness of hole injecting and transporting layer and thickness of electron injecting and transporting layer are comparable to the thickness of the light emitting layer or about 1/10 time to 10 times as large as that of light emitting layer, though the thickness may vary depending on the design of recombination-light emission region. When the hole or electron injecting and transporting layer is divided into an injecting layer and a transporting layer, the injecting layer preferably has a thickness of no less than 1 nm and the transporting layer preferably has a thickness of no less than 20 nm. Upper limit of the thickness of the injecting layer and transporting layer is usually about 500 nm for injecting layer and about 500 nm for the transporting layer. The thickness relationship mentioned above holds also to a case of providing two injecting and transporting layers.

Into the light emitting layer of the organic EL device of the present invention is incorporated a fluorescent material which is a compound having a light emitting function. As examples of said fluorescent material, at least one compound selected from the group consisting of quinacridone, rubrene, styryl dyes and the like can be referred to. Also, quinoline derivatives such as metal complex dyes containing 8-quinolinol or derivatives thereof as a ligand, such as tris(8-quinolinolato)-aluminum and the like; tetraphenylbutadiene, anthracene, perylene, coronene, and 12-phthaloperinone derivatives and the like can be referred to. Further, the phenylanthracene derivatives disclosed in Japanese Patent Application No. 110569/1994, the tetraarylethene derivatives disclosed in Japanese Patent Application No. 114456/1994 can also be used.

Preferably, these compounds are used in combination with a host material capable of emitting light by itself. That is, the use of them as a dopant is preferable. The content of the light emitting compound in the light emitting layer is preferably 0.01–10% by weight and further preferably 0.1–5% by weight. By using these compounds in combination with a host material, the light emission wavelength of host material can be altered, by which a light emission shifted to the longer wavelength region becomes possible and light emission efficiency and stability of device can be improved.

As the host material, quinolinolato complexes are preferable, and aluminum complexes containing 8-quinolinol or derivatives thereof as a ligand are further preferable. As such aluminum complexes, those disclosed in JP-A 264692/1988, 255190/1991, 70733/1993, 258859/1993, 215874/1994, etc. can be referred to.

Illustrative examples include tris(8-quinolinolato)-aluminum, bis(8-quinolinolato)-magnesium, bis(benzo{f}-8-quinolinolato)-zinc, bis(2-methyl-8-quinolinolato)-aluminum oxide, tris(8-quinolinolato)-indium, tris(5-methyl-8-quinolinolato)-aluminum, 8-quinolinolato-lithium, tris(5-chloro-8-quinolinolato)-gallium, bis(5-chloro-8-quinolinolato)-calcium, 5,7-dichloro-8-quinolinolato-aluminum, tris(5,7-dibromo-8-hydroxyquinolinolato)-aluminum, poly[zinc(II)-bis(8-hydroxy-5-quinolinyl)-methane], and the like.

Further, the host material may also be an aluminum complex having another ligand in addition to the 8-quinolinol or derivative thereof. Example of such host material include the following: bis(2-methyl-8-quinolinolato)(phenolato)-aluminum(III), bis(2-methyl-8-quinolinolato)(o-cresolate)-aluminum(III), bis(2-methyl-8-quinolinolato)(p-cresolato)-aluminum(III), bis(2-methyl-8-quinolinolato)(o-phenyl-phenolato)-aluminum(III), bis(2-methyl-8-quinolinolato)(m-phenylphenolato)-aluminum(III), bis(2-methyl-8-quinolinolato)(p-phenylphenolato)-aluminum(III), bis(2-methyl-8-quinolinolato)(2,3-dimethylphenolato)-aluminum(III), bis(2-methyl-8-quinolinolato)(2,6-dimethylphenolato)-aluminum(III), bis(2-methyl-8-quinolinolato)(3,4-dimethyl-phenolato)-aluminum(III), bis(2-methyl-8-quinolinolato)(3,5-dimethylphenolato)-aluminum(III), bis(2-methyl-8-quinolinolato)(3,5-di-tert-butylphenolato)-aluminum(III), bis(2-methyl-8-quinolinolato)(2,6-diphenylphenolato)-aluminum(III), bis(2-methyl-8-quinolinolato)(2,4,6-triphenyl-phenolato)-aluminum(III), bis(2-methyl-8-quinolinolato)-(2,3,6-trimethylphenolato)-aluminum(III), bis(2-methyl-8-quinolinolato)(2,3,5,6-tetramethylphenolato)-aluminum(III), bis(2-methyl-8-quinolinolato)(1-naphtholato)-aluminum(III), bis(2-methyl-8-quinolinolato)(2-naphtholato)-aluminum(III), bis(2,4-dimethyl-8-quinolinolato)(o-phenylphenolato)-aluminum(III), bis(2,4-dimethyl -8-quinolinolato)(p-phenylphenolato)-aluminum(III), bis(2,4-dimethyl-8-quinolinolato)(m-phenyl-phenolato)-aluminum(III), bis(2,4-dimethyl-8-quinolinolato)-(3,5-dimethylphenolato)-aluminum(III), bis(2,4-dimethyl-8-quinolinolato)(3,5-di-tert-butylphenolato)-aluminum(III), bis(2-methyl-4-ethyl-8-quinolinolato)(p-cresolato)-aluminum(III), bis(2-methyl-4-methoxy-8-quinolinolato)(p-phenyl-phenolato)-aluminum (III), bis(2-methyl-5-cyano-8-quinolinolato)(o-cresolato)-aluminum(III), bis(2-methyl-6-trifluoromethyl-8-quinolinolato)-(2-naphtholato)-aluminum(III), and the like.

Apart from the above, the following host materials can also be referred to: bis(2-methyl-8-quinolinolato)-aluminum (III)-$\mu$-oxo-bis(2-methyl-8-quinolinolato)-aluminum(III), bis(2,4-dimethyl-8-quinolinolato)-aluminum(III)-$\mu$-oxo-bis(2,4-dimethyl-8-quinolinolato)-aluminum(III), bis(4-ethyl-2-methyl-8-quinolinolato)-aluminum(III)-$\mu$-oxo-bis(4-ethyl-2-methyl-8-quinolinolato)-aluminum(III), bis(2-methyl-4-methoxyquinolinolato)-aluminum(III)-$\mu$-oxo-bis(2-methyl-4-methoxyquinolinolato)-aluminum(III), bis(5-cyano-2-methyl-8-quinolinolato)-aluminum(III)-$\mu$-oxo-bis(5-cyano-2-methyl-8-quinolinolato)-aluminum(III), bis(2-methyl-5-trifluoromethyl-8-quinolinolato)-aluminum(III)-$\mu$-oxo-bis(2-methyl-5-trifluoro-methyl-8-quinolinolato) aluminum(III), and the like.

As other preferable host materials than the abovementioned ones, the phenylanthracene derivatives described in Japanese Patent Application No. 110569/1994, the tetraaryl-ethene derivatives described n Japanese Patent Application No. 114456/1994 and the like can be referred to.

The light emitting layer may function as an electron injecting and transporting layer simultaneously. In such a case, the use of tris(8-quinolinolato)-aluminum and the like is preferable. These fluorescent materials can be deposited by the method of evaporation.

It is also preferable to prepare the light emitting layer as a mixed layer of at least one hole injecting and transporting compound and at least one electron injecting and transporting compound, if necessary. It is preferable to incorporate a dopant into the mixed layer. Preferably the content of the compound in such a mixed layer is 0.11–20% by weight, and further preferably 0.1–15% by weight.

In the mixed layer, carrier hopping conduction paths are formed, which allow carriers to move through a polarly predominant material while injection of carriers of opposite polarity is rather inhibited, and the organic compound is less susceptible to damage, resulting in an advantage of a prolonged device life. By incorporating the aforementioned dopant into such a mixed layer, the light emission wavelength of the mixed layer itself can be altered and light emission can be shifted to a longer wavelength region, with improvement in luminous intensity and stability of the device.

The hole injecting and transporting compound and electron injecting and transporting compound used in the mixed layer may be selected from compounds for the hole injecting and transporting layer and compounds for electron injecting and transporting layer which will be detailed later, respectively. It is especially preferable to select the hole injecting and transporting compound from amine derivatives having strong fluorescence, such as triphenyldiamine derivatives which are hole transporting materials, styrylamine derivatives and amine derivatives having an aromatic fused ring.

The electron injecting and transporting compound is preferably selected from quinoline derivatives and metal complexes having 8-quinolinol or derivatives thereof as a ligand, and the use of tris(8-quinolinolato)-aluminum (Alq3) is especially preferable. The aforementioned phenylanthracene derivatives and tetraarylethene derivatives are also preferably used.

The hole injecting and transporting compound is preferably selected from amine derivatives having a strong fluorescence, such as the aforementioned triphenyldiamine derivatives which are the aforementioned hole transporting materials, styrylamine derivatives and amine derivatives having an aromatic fused ring.

The mixing ratio is preferably determined with consideration of the carrier mobility and carrier density of each layer. Generally speaking, it is preferable to select the ratio so that the ratio (by weight) of hole injecting and transporting compound to electron injecting and transporting compound falls in the range of about 1/99 to about 99/1, further preferably about 10/90 to about 90/10, and especially about 20/80 to about 80/20.

Thickness of usual mixed layer preferably ranges from the thickness of mono-molecular layer to a thickness smaller than the thickness of organic compound layer. More specifically saying, thickness of the mixed layer is preferably 1–85 nm, further preferably 5–60 nm, and especially 5–50 nm.

The mixed layer is preferably formed by a co-deposition of vapors vaporized from different vapor sources. In a case where vapor pressures (evaporation temperatures) of the compounds are comparable to each other or very close to each other, there may be adopted a technique of previously mixing together the different vapors in one board and then depositing the vapor mixture. Although the mixed layer is preferably a uniform mixture of both compounds, a structure in which one of the compounds is island-wise distributed in the other compound is also allowable. The light emitting layer is usually formed so as to have a predetermined thickness by evaporation of an organic fluorescent substance or by coating an organic fluorescent substance dispersed in a binder.

In the hole injecting and transporting layer, there may be used various organic compounds such as described In JP-A 295695/1988, 191694/1990, 792/1991, 234681/1993, 239455/1993, 299174/1993, 126225/1995, 126226/1995, 100172/1996, and EP 0650955A1. Examples thereof include tetraarylbenzidine compounds (triaryldiamine or triphenyldiamine: TPD), aromatic tertiary amines, hydrazone derivatives, carbazole derivatives, triazole derivatives, imidazole derivatives, amino group-containing oxadiazole derivatives, polythiophene, and the like. These compounds may be used in combination of two or more, if desired. When two or more compounds are used in combination, the compounds may be used as a laminate of separate layers or as a mixture.

In a case where the hole infecting and transporting layer is separated into a hole injecting layer and a hole transporting layer and provided as separate layers, preferable combination of compounds may be selected from the compounds for hole injecting and transporting layer. In this case, it is preferable to laminate the layers in such an order that a compound having a lower ionization potential comes closer to the hole infecting electrode (ITO, etc.). Further, it is preferable to use a compound of good thin film formability at the hole injecting electrode surface. The order of lamination is applicable also to cases where a plurality of hole injecting and transporting layers are provided. Such an order of lamination is effective or lowering the drive voltage and preventing current leakage and development and growth of dark spots. Since evaporation is utilized in the manufacture of devices, films as thin as about 1 to 10 nm can be formed uniformly and without pin-hole, due to which any change in color tone of light emission and any drop of efficiency caused by re-absorption can be prevented even if a compound having a low ionization. potential and absorption in the visible region is used in the hole injecting layer. Like the light emitting layer, the hole injecting and transporting layer can be formed by evaporation of the aforementioned compounds.

In the electron injecting and transporting layer which is optionally provided, there can be used quinoline derivatives such as organometallic complexes having as a ligand 8-quinolinol or derivatives thereof such as tris(8-quinolinolato)-aluminum (Alq3) or the like, oxadiazole derivatives, perylene derivatives, pyridine derivatives, pyrimidine derivatives, quinoxalane derivatives, diphenylquinone derivatives, nitro-substituted fluorene derivatives and the like. The electron injecting and transporting layer may simultaneously function as a light emitting layer, and in such as case the use of tris(8-quinolinolato)-aluminum and the like is preferred. Like light emitting layer, the electron injecting and transporting layer may be formed by evaporation or the like.

In a case where the electron injecting and transporting layer is separated into an electron injecting layer and an electron transporting layer and separately laminated, preferable combination of the compounds for electron injecting and transporting layer can be selected and used. In this case, the compounds are preferably laminated in such an order that a compound having a higher electron affinity comes closer to the electron injecting electrode. Such an order of lamination is applicable also to a case where a plurality of electron injecting and transporting layers are provided.

The organic layers such as hole injecting and transporting layer, light emitting layer and electron injecting and transporting layer are preferably formed by the vacuum evaporation method, because homogeneous thin films can be formed thereby. When vacuum evaporation method is used, there is obtained a homogeneous thin film which is amorphous or has a grain size of less than 0.1 $\mu$m. If the grain size is greater than 0.1 $\mu$m, an uneven light emission takes place and the drive voltage of the device must be increased with a substantial drop of hole injection efficiency. The conditions for vacuum evaporation are not critical although a vacuum of $10^{-4}$ Pa or lower and an evaporation rate of about 0.01 to 1 nm/sec are preferred. It is preferable to form layers successively in vacuum because adsorption of impurities on the interfaces between layers can be prevented and better performance can be ensured thereby. Also, the drive voltage of a device can be reduced and the development and growth of dark spots can be restrained thereby.

In an embodiment wherein the respective layers are formed by vacuum evaporation and it is intended to incorporate a plurality of compounds into a single layer, it is preferable to carry out a co-deposition using a plurality of boats containing each compound while controlling the temperatures of the boats individually.

The organic EL light emitting device of the present invention comprises a hole injecting electrode provided on a substrate, an electron injecting electrode provided thereon, at least one hole transporting layer and at least one light emitting layer interposed between the two electrodes, and a protective electrode as an uppermost layer, provided that the hole transporting layer and the protective layer may be omitted, if desired.

Since the hole injecting electrode is usually so constructed as to take out the emitted light from the substrate side, it is preferably a transparent electrode or a semi-transparent electrode. As the transparent electrode, ITO (tin-doped indium oxide), IZO (zinc-doped indium oxide), ZnO, SnO$_2$, In$_2$O$_3$ and the like can be referred to, of which ITO (tin-doped indium oxide) and IZO (zinc-doped indium oxide) are preferred. ITO usually contains In$_2$O$_3$ and SnO$_2$ at a stoichiometric ratio, though the quantity of O may somewhat deviate from the stoichiometric quantity. If ITO is expressed by InO$_x$.SnO$_y$, X is preferably in the range of 1.0 to 2.0, and Y is preferably in the range of 0.8 to 1.2. Mixing ratio of SnO$_2$ to In$_2$O$_3$ is preferably in the range of 1 to 20% and further preferably in the range of 5 to 12%, both by mole. IZO usually contains In$_2$O$_3$ and ZnO at a stoichiometric ratio, though the quantity of O may somewhat deviate from the stoichiometric quantity. If IZO is expressed by InO$_y$.ZnO$_z$, Y is preferably in the range of 1.0 to 2.0 and Z is preferably in the range of 0.8 to 1.2, both by mole. Mixing ratio of ZnO$_2$ to In$_2$O$_3$ is preferably in the range of 1 to 20% and further preferably 5 to 12%, both by mole. In addition to the above, Sn, Ti, Pb and the like may be present in the form of oxides, in an amount of 1% by mole or less when calculated as oxide.

Thickness of the hole injecting electrode may be any thickness, so far as it is not smaller than a thickness at which holes can sufficiently be injected. Preferable thickness is 50–500 nm, and further preferable thickness is 50–300 nm. Although upper limit of the thickness is not critical, too large a thickness is disadvantageous because the risk of peeling off arises. If the thickness is too small, there may be problems in the film strength at the time of manufacture and electron-transporting ability.

Although the hole injecting electrode layer can be formed by the evaporation method, it is preferably formed by the method of sputtering. When sputtering is used for formation of ITO transparent electrode, it is preferable to adopt the DC sputtering process or RF sputtering process using a target prepared by doping In$_2$O$_3$ with SnO$_2$. An ITO transparent electrode film prepared by sputtering process is smaller than that prepared by evaporation method in the change with time of light emission luminance. The input electric power is preferably in the range of 0.1 to 4 W/cm$^3$. Especially, the electric power for DC sputtering apparatus is preferably 0.1 to 10 W/cm$^2$, and further preferably 0.5 to 7 W/cm$^2$. The film deposition rate is preferably 5 to 100 nm/min. and especially 10–50 nm/min.

The sputtering gas is not critical, but inert gases such as Ar, He, Ne, Kr, Xe and the like or gaseous mixtures thereof can be used. Pressure of the sputtering gas at the time of sputtering is usually about 0.1 to about 20 Pa.

As the material constituting the electron injecting electrode to be made into a film, substance of low work function capable of injecting electron effectively are preferred. Examples thereof include simple metallic elements such as K, Li, Na, Mg, La, Ce, Ca, Sr, Ba, Al, Ag. In, Sn, Zn, Sr, Cs, Er, Eu, Ga, Hf, Nd, Rb, Sc, Sm, Ta, Y, Yb and the like, and compounds such as BaO, BaS, CaO, HfC, LaB$_6$, MgO, MoC, NbC, PbS, SrO, TaC, ThC, ThO$_2$, ThS, TiC, TiN, UC, UN, UO$_2$, W$_2$C, Y$_2$O$_3$, ZrC, ZrN, ZrO$_2$ and the like. In order to improve the stability, it is preferable to use a binary or ternary alloy system containing metallic elements. Preferable alloy systems include aluminum alloys such as Al.Ca (Ca: 5–20 at %), Al.In (In: 1–10 at %), Al.Li (Li: 0.1–less than 20 at %), Al.R (R is rare earth element including Y and Sc), and the like, In.Mg (Mg: 50–80 at %), etc. Of these alloys, simple Al element and aluminum alloys such as Al.Li (Li: 0.4–6.5 (6.5 is excepted) at %) or (Li: 6.5–14 at %), Al.R (R: 0.1–25, and especially 0.5–20 at %) are especially preferable because compression stress does not arise readily. Accordingly, as the sputtering target, such electron injecting electrode-constituting metals and alloys as mentioned above are usually used. These substances have a work function of no more than 4.5 eV. Metals and alloys having a work function of no more than 4.0 eV are especially preferred.

By using a sputtering process for making the film of electron injecting electrode, the atoms and atomic groups in the formed electron injecting electrode film can possess higher energy of motion than in the film prepared by evaporation method, so that a surface migration effect is exhibited and the adhesiveness at interfaces between organic layers is improved. Further, since sputtering makes it possible to remove the superficial oxide layer in vacuum and, by carrying out an inverse sputtering, the water and oxygen adsorbed on the interfaces between organic layers can be removed, due to which a organic EL device high in quality and stability can be obtained. As the target, simple metal or alloys of the aforementioned formulation range are preferable, and targets of additive components may be used additionally. Further, even if a mixture of materials greatly different in vapor pressure is used as the target, no great difference arises between formulations of the resulting film and the target, so that the material used is not restricted unlike in the evaporation method. Further, the period of time necessary for supplying the material is shorter than in the evaporation method and the resulting film is excellent in uniformity of thickness and quality, which is advantageous from the viewpoint of productivity.

Since the electron injecting electrode formed by the sputtering process is a tight and dense film, it is prevented from the ingress of moisture unlike the coarse evaporation film, due to which an organic EL device high in chemical stability and long in lifetime can be obtained.

The pressure of the sputtering gas in the process of sputtering is preferably in the range of 0.1 to 5 Pa. By controlling the pressure of sputtering gas in this range, an AlLi alloy having a lithium concentration falling in the aforementioned range can be obtained easily. Further, by changing the pressure of sputtering gas in this range during film formation, an electron injecting electrode having a graded Li concentration can easily be obtained. Further, it is preferable to form the film under such conditions that the product of film-forming gas pressure and target-target distance in substrate falls in the range of 20 to 65 Pa.cm.

As the sputtering gas, inert gases conventionally used in sputtering apparatuses may be used and, in addition, reactive gases such as N$_2$, H$_2$, O$_2$, C$_3$H$_4$, NH$_3$ and the like are also usable.

The sputtering process may be a high frequency sputtering process using an RF power supply, although a DC sputtering process is preferably used because the rate of film deposition is easy to control and the damage on organic EL device structure can be minimized. The power supplied to the DC sputtering apparatus is preferably in the range of 0.1 to 10 W/cm$^2$, and especially 0.5 to 7 W/cm$^2$. The rate of film deposition is preferably in the range of 5 to 100 nm/min., and especially 10 to 50 nm/min.

Thickness of the electron injecting electrode film may be any thickness, so far as it is not smaller than a certain level necessary for carrying out electron injection sufficiently. It is typically no less than 1 nm, and especially no less than 3 nm. Although upper limit thereof is not critical, the thickness is usually in the range of about 3 to about 500 nm.

The organic EL device of the present invention may have a protective electrode on the electron injecting electrode, namely in the other side of the organic layer. By providing a protective layer, the electron injecting layer is protected against atmospheric air and moisture, the constituent thin films are prevented from deterioration, the efficiency of electron injection is stabilized, and the lifetime of device is greatly improved. The protective electrode has an extremely low resistance, and can function as a wiring electrode when resistance of the electron injecting electrode is high. The protective electrode is constituted of at least one member selected from Al, combination of Al and rare earth element (except for Ti), and combination of Ti and titanium nitride (TiN). When one of these materials is used singly, the content of the materials in the protective electrode is preferably at least in the following ranges: Al: 90–100 at %, Ti: 90–100 at %, TiN: 90–100 mol %. When two or more of these materials are used, the mixing ratio may be arbitrarily selected, although in the mixture of Al and Ti, the content of Ti is preferably 10 at % or less. It is also allowable to laminate a plurality of single material layers. Especially, the use of Al or combination of Al and rare earth element brings about a good result when used as a wiring electrode which will be mentioned later. TiN has a high corrosion resistance, and exhibits an excellent effect as a sealing film. The actual formulation of TiN may deviate from the stoichiometric formulation up to an extent of about 10%. The alloy of Al and rare earth element may contain a rare earth element, especially Mg, Sc, Nb, Zr, Hf, Nd, Ta, Cu, Si, Cr, Mo, Mn, Ni, Pd, Pt, W etc., in such an amount that total sum thereof comes to 10 at % or less, preferably 5 at % or less, and especially 1 at % or less. A lower content of rare earth element gives a lower thin film resistance, when the thin film is made to function as a wiring material.

The protective film may have a thickness equal to or in excess of a certain level necessary to prevent the ingress of moisture, oxygen ad organic solvent, and it is preferably 50 nm or more, further preferably 100 nm or more, and especially 100–1,000 nm. If thickness of the protective electrode layer is too small, the effect of the present invention cannot be achieved, and the protective layer is low in the step-covering ability so that connection with terminal electrode is insufficient. On the other hand, if thickness of the protective layer is too large, the stress in the protective electrode layer increases, so that the rate of growth of dark spot is high. when the protective electrode is made to function as a wiring electrode, thickness of the electron injecting electrode film is small so that the film resistance thereof is high, and in order to compensate this phenomenon, the protective electrode layer should have a thickness of about 100 to about 500 nm. In other cases where the protective layer is made to function as a wiring electrode, thickness of the protective layer is about 100 to about 300 nm.

Although the overall thickness of the sum of electron injecting electrode and the protective electrode is not critical, it is usually from about 100 nm to about 1,000 nm.

Figure 1:
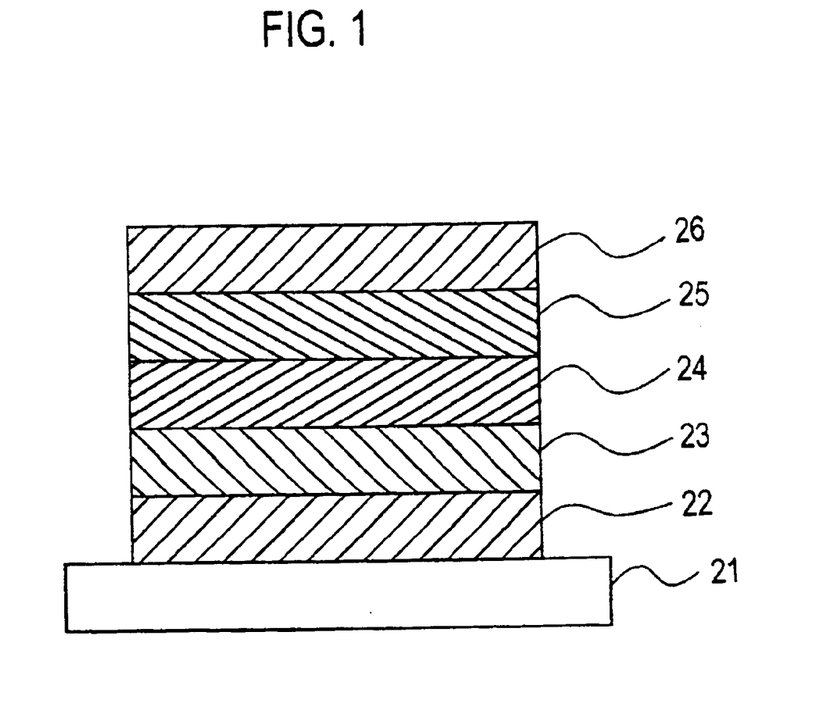
FIG. 1 is a schematic view illustrating the construction of an organic EL device.

FIG. 1 illustrates an example of the construction of the organic EL device manufactured according to the present invention. The EL device of FIG. 1 comprises a hole injecting electrode 22, a hole injecting and transporting layer 23, a light emitting and electron injecting and transporting layer 24, an electron injecting electrode 25 and a protective electrode 26 which are successively provided on a substrate 21.

The construction of the EL device of the present invention is not limited to that shown in FIG. 1, but a variety of other constructions can be adopted. For instance, in another allowable construction, a single light emitting layer is provided, and an electron injecting and transporting layer is provided between the light emitting layer and an electron injecting electrode. In yet another allowable construction, the hole injecting and transporting layer and the light emitting layer is made into a mixed layer.

Each of the organic layers such as hole injecting electrode, electron injecting electrode and light emitting layer may be patterned according to the etching method or the like after the mask evaporation or film deposition, necessary, and thereby a desired light emission pattern can be obtained. When the substrate is a thin film transistor (TFT), the films may be patterned according to the pattern of the substrate, whereby a display pattern and a drive pattern can be obtained directly.

After deposition of the electrode films, a protective film made of an inorganic material such as $SiO_x$ or an organic material such as Teflon, chlorine-containing fluorocarbon polymer or the like may be formed in addition to the aforementioned protective electrode. The protective film referred to herein may be any of transparent file and opaque film, and thickness thereof is about 50 to about 1,200 nm. This protective film can be formed by the aforementioned reactive sputtering process, general sputtering process, vapor deposition process, etc.

It is preferable to provide a sealing layer on the device in order to protect the organic layers and electrodes of the device against oxidation. The sealing layer is formed by tightly bonding and sealing a sealing plate such as glass plate or the like by the use of an adhesive resin such as commercially available moisture-intercepting photosetting adhesives, epoxy type adhesives, silicone type adhesives, crosslinked ethylene-vinyl acetate copolymer adhesive sheet or the like in order to prevent the ingress of moisture. Apart from glass plate, metallic plates, plastic plates and the like are also usable for this purpose.

As the substrate material, transparent and semi-transparent materials such as glass, quartz, resins and she like can be used. A color filter film, a fluorescent substance-containing color-converting film or a dielectric reflective film may also be used as the substrate in order to control the color of emitted light.

As the color filter film, the same color filter as used in the liquid crystal display may be used. For optimizing the efficiency of taking out and color purity, characteristics of the color filter should be controlled so as to fit with the light emitted from the organic EL.

If a color filter capable of cutting the exterior light of short wavelength which can be absorbed by the EL device material and fluorescence-converting layer is used, light resistance of device and contrast of display can be improved.

It is also allowable to use an optical thin film such as dielectric multi-layer film in place of color filter.

The fluorescence-converting filter film absorbs the light emitted from EL, emits a light from the fluorescent material in the fluorescence-converting film, and thereby converts the color of emitted light, and it is constituted of a binder, a fluorescent material and a light-absorbing material.

Fundamentally, the fluorescent material should be selected from materials having a high fluorescent quantum yield, and materials having an intense absorption in the EL light emitting wavelength region are preferable. Actually, laser dyes are suitable, of which examples include rhodamine compounds, perylene compounds, cyanine compounds, phthalocyanine compounds including Subphthalo and the like, naphthaloimide compounds, fused ring hydrocarbon compounds. fused ring heterocyclic compounds, styryl compounds, coumarin compounds and the like.

As the binder, a material not extinguishing the fluorescence should fundamentally be selected, and materials capable of doing fine patterning through photolithography, printing or the like are preferred. Also, materials undergoing no damage at the time of formation of ITO film are preferable.

A light absorbing material is used when the fluorescent material is insufficient in light absorption. When it is unnecessary, its use may be omitted. The light absorbing material should be selected from materials not extinguishing the fluorescence of fluorescent material.

Although the organic EL device of the present invention is usually used as a DC driving type EL device, it may also be used as an AC driving type or pulse driving type of device. The input voltage is usually about 2 to about 20 V.

EXAMPLES

Next, concrete examples of the present invention are presented together with comparative examples to explain the invention in more detail.

Example 1

On a glass substrate, a film of ITO transparent electrode (hole injecting electrode) having a film thickness of 85 nm was formed and patterned so as to constitute 64 dots×7 lines of picture elements (280×280 $\mu$m per picture element). On the ITO electrode thus formed, there was found 3/mm$^2$ of protrusions each having a height of at most about 0.2 $\mu$m. Then, the substrate carrying thereon a patterned hole injecting electrode was subjected to ultrasonic washing using a neutral detergent, acetone and ethanol, and taken out from boiling ethanol and dried. Then, the surface was cleaned with UV/O$_3$, the substrate was fixed on a substrate holder of a vacuum evaporation chamber, and the inner atmosphere of the chamber was evacuated to a pressure of 1×10$^{-4}$ Pa or lower. In this state, the average number of floating dusts having a particle size of 0.3 to 1 $\mu$m present in the chamber was 1,000/m$^3$, and the average particle size thereof was 0.5 $\mu$m. Then, N,N'-diphenyl-N,N'-bis[N-phenyl-N-4-tolyl(4-aminophenyl)]-benzidine (ATP34) of the following structure:

was evaporated at a deposition rate of 0.2 nm/sec up to a thickness of 100 nm to prepare a hole injecting layer. Then, while maintaining the reduced pressure, N,N'-diphenyl-N, N'-m-tolyl-4,4'-diamino-1,1'-biphenyl (TPD) was evaporated at a deposition rate of 0.2 nm/sec up to a thickness of 35 nm to prepare a hole transporting layer. The hole mobility in this hole transporting layer was 2.7×10$^{-3}$ V.s/cm$^2$. Further, while maintaining the reduced pressure, tris(8-quinolinolato)-aluminum (Alq3) was evaporated at a deposition rate of 0.2 nm/sec up to a thickness of 50 nm to prepare an electron transporting light emitting layer. Then, while maintaining the reduced pressure, MgAg was co-deposited (binary deposition) at a deposition rate of Mg:Ag=1:10 up to a thickness of 200 nm to prepare an electron injecting electrode. Then, while maintaining the reduced pressure, the EL device substrate thus obtained was transferred into a sputtering apparatus, and an Al protective electrode having a thickness of 200 nm was formed at a sputtering pressure of 0.3 Pa by DC sputtering process using Al target. As the sputtering gas, Ar was used. The input power was 500 W, the size of target was 4 inches, and the distance between substrate and target was 90 mm. Finally, a glass sealing plate was bonded by the use of a binder to seal the EL device.

By repeating the procedure mentioned above, ten organic EL device samples were prepared. On each dot (pixel) of the samples, diode characteristic properties, namely insulating resistance in the inverse direction, was measured to investigate presence of leakage. An insulating resistance of 300 M$\Omega$ or less was taken as indicating presence of leakage. As a result, leakage was found in 134 dots among the 64×7×10=4,480 dots, which means that the rate of leakage development was less than 30%.

Subsequently, a direct current voltage was applied to the organic EL device obtained above in the atmospheric air to drive the device continuously at a constant current density of 10 mA/cm$^2$. In the early stage, a light emission of 7.1 V, 290 cd/m$^2$, green color (maximum wavelength of light emission $\lambda$max=530 nm) was observed.

Example 2

Samples were prepared and evaluated in the same manner as in Example 1, except that thickness of the hole injecting layer formed of N,N'-diphenyl-N,N'-bis[N-phenyl-N-4-tolyl(4-aminophenyl)]-benzidine (ATP34) was altered to 300 nm. As a result, leakage was found in zero dot among the 64×7×10=4,480 dots, which means the leakage development rate was zero percent.

Subsequently, a direct current voltage was applied to the organic EL device obtained above in the atmospheric air to drive the device continuously at a constant current density of 10 mA/cm$^2$. In the early stage, a light emission of 8.2 V, 250 cd/m$^2$, green color (maximum wavelength of light emission $\lambda$max=530 nm) was observed.

Example 3

Samples were prepared and evaluated in the same manner as in Example 1, except that thickness of the hole injecting layer formed of N,N'-diphenyl-N,N'-bis[N-phenyl-N-4-tolyl(4-aminophenyl)]-benzidine (ATP34) was altered to 400 nm. As a result, leakage was found in zero dot among the 64×7×10=4,480 dots, which means the leakage development rate was zero percent.

Subsequently, a direct current voltage was applied to the organic EL device obtained above in the atmospheric air to drive the device continuously at a constant current density of 10 mA/cm$^2$. In the early stage, a light emission of 11 V, 70 cd/m$^2$, green color (maximum wavelength of light emission $\lambda$max=530 nm) was observed.

Comparative Example 1

Samples were prepared and evaluated in the same manner as in Example 1, except that thickness of the hole injecting layer formed of N,N'-diphenyl-N,N'-bis[N-phenyl-N-4-tolyl(4-aminophenyl)]-benzidine (ATP34) was altered to 40 nm. As a result, leakage was found in 4,405 dots among the 64×7×10=4,480 dots, which means the leakage development rate was 98% or more.

Subsequently, a direct current voltage was applied to the organic EL device obtained above in the atmospheric air to drive the device continuously at a constant current density of 10 mA/cm$^2$. In the early stage, a light emission of 7 V, 300 cd/m$^2$, green color (maximum wavelength of light emission λmax=530 nm) was observed.

EFFECT OF THE INVENTION

As has been mentioned above, according to the present invention, an organic EL device capable of preventing current leakage and maintaining a long lifetime, a high luminance, a high efficiency and a high display quality can be obtained.

What is claimed is:

1. An organic EL device comprising a hole injecting electrode, an electron injecting electrode and one or more organic layers provided between the two electrodes, wherein at least one of the organic layers has a film thickness of no less than 100 nm and an electron- or hole-mobility of 0.5 to 5×10$^{-3}$ cm$^2$/V.s, wherein said at least one organic layer is formed in an environment containing dusts, and said film thickness of no less than 100 nm is also at least 20% of the average particle diameter of said dusts.

2. The organic EL device of claim 1, wherein said at least one of the organic layers is located at a position forming the lowermost layer and functions as any one of hole injecting layer, hole transporting layer, hole injecting and transporting layer and light emitting layer, and film thickness thereof is 100 to 400 nm.

* * * * *